United States Patent
Murakami

(10) Patent No.: US 6,552,393 B2
(45) Date of Patent: Apr. 22, 2003

(54) POWER MOS TRANSISTOR HAVING INCREASED DRAIN CURRENT PATH

(75) Inventor: Norio Murakami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/956,460

(22) Filed: Sep. 20, 2001

(65) Prior Publication Data

US 2002/0145170 A1 Oct. 10, 2002

(30) Foreign Application Priority Data

Apr. 5, 2001 (JP) ........................................ 2001/107607

(51) Int. Cl.[7] .................. H01L 29/76; H01L 29/94; H01L 29/80; H01L 31/112
(52) U.S. Cl. .................. 257/343; 257/409; 257/262; 257/260
(58) Field of Search ............................ 257/343, 409, 257/262, 256, 260, 261, 272, 288

(56) References Cited

U.S. PATENT DOCUMENTS 5,294,824 A * 3/1994 Okada ......................... 257/343
5,898,201 A * 4/1999 Hsu et al. ..................... 257/343

OTHER PUBLICATIONS

V. Rumennik, A 1200 V BiCMOS Technology and its Applications, Proceedings of 1992 International Symposium on Power Semiconductor Devices & ICs, pp. 322–327.

* cited by examiner

Primary Examiner—Steven Loke
(74) Attorney, Agent, or Firm—Volentine Francos, PLLC

(57) ABSTRACT

A power MOS transistor that permits a large current to flow without a broad gate width being employed. The power MOS transistor includes a substrate of a first conductivity type; a well region of a second conductivity type; a first electrode region whose impurity concentration is higher than the well region; a region of a first conductivity type; and a second electrode region. The first electrode region, first-conductivity-type region and second electrode region are respectively arranged in this order spaced apart from one another in a first direction. The first-conductivity-type region includes a plurality of first-conductivity-type sub-regions, which are provided spaced apart from one another in a second direction that is orthogonal to the first direction. A surface channel region is formed between adjacent first-conductivity-type sub-regions.

8 Claims, 6 Drawing Sheets

POWER MOS TRANSISTOR HAVING INCREASED DRAIN CURRENT PATH

BACKGROUND OF THE INVENTION

1. Field of the Invention

The present invention relates to a semiconductor element for electrical power control, such as for motor control, a power circuit, or illumination control, and more particularly to a power MOS transistor that is highly pressure-resistant and is for use with a high current.

2. Description of Related Art

Conventionally, as one example of the constitution of a power MOS transistor, a lateral power MOS structure is known, which appears in Document 1 (Document 1: Proceedings International Symposium on Power Semiconductor Devices & IC's, Tokyo, pp.322–327: A 1200V BiCMOS TECHNOLOGY AND ITS APPLICATIONS), for example. In addition, ICs (intelligent power elements), in which a lateral power MOS transistor of this kind and a control circuit are mounted on a chip, are well known.

The structure of the lateral power MOS transistor of Document 1 will be described hereinbelow in a straightforward manner with reference to FIG. 6(A) and FIG. 6(B).

In FIG. 6(A) and FIG. 6(B), the reference numeral 100 represents a conventional lateral power MOS transistor. An N well layer 104, which constitutes a drain, is formed at a given depth, in a thickness direction, from the surface of a P-type semiconductor substrate 102. Within this N well layer 104, a drain N+ diffusion layer 106 is formed, and $SiO_2$ films 108 and 108x are respectively formed on both sides of drain N+ diffusion layer 106. A source N+ diffusion layer 110 is provided in the surface of substrate 102 and a gate oxide film 112 is provided on substrate 102 and between source N+ diffusion layer 110 and N well layer 104. Within N well layer 104 which is beneath the $SiO_2$ film 108x that is between gate oxide film 112 and drain N+ diffusion layer 106, a P+ layer 114 is formed. A gate electrode 116 is formed on gate oxide film 112. A drain electrode 118 is provided on drain N+ diffusion layer 106. A source electrode 120 is formed on source N+ diffusion layer 110. Drain electrode 118 and source electrode 120 are aluminum wiring. Consequently, this wiring 118 and 120 are isolated by a PSG film 122, which is provided above substrate 102. In addition, a passivating film 124 is formed so as to cover drain electrode 118 and source electrode 120, and PSG film 122.

In order to furnish this transistor 100 with high pressure-resistance characteristics, N well layer 104, which constitutes a drain, is formed at a given depth in the thickness direction of the substrate. As a consequence, it is possible to alleviate an electric field of a magnitude from several tens of volts to several hundreds of volts, or occasionally several thousands of volts, which is applied to drain 104.

$SiO_2$ film 108x is provided at the upper face of N well layer 104 and so as to adjoin gate oxide film 112. This $SiO_2$ film 108x serves to permit a high electric field to be released from drain 104 to gate electrode 116, and also makes it possible to prevent the destruction, by a high electric field, of the insulation constituted by gate oxide film 112.

Furthermore, P+ layer 114 is formed beneath the $SiO_2$ film 108x that is between gate oxide film 112 and drain N+ diffusion layer 106. As a result, requirements are satisfied for the basic constitution of a junction-type FET 150 in which this P+ layer 114 and substrate 102 constitute a gate, drain N+ diffusion layer 106 is a drain, and source N+ diffusion layer 110 is a source. Also, a depletion layer is formed that extends from the gate region of this junction-type FET 150 to the channel region constituted by N well layer 104. This depletion layer fulfils the task of releasing the electric field from the drain. Consequently, operation by the lateral power MOS transistor within a high voltage range can be ensured.

Formation of junction-type FET 150 inside the lateral power MOS transistor discussed above whose structure is shown in FIGS. 6(A) and 6(B) is ultimately limited by the voltage drop of the drain current across this FET structure. As shown by the dotted line, the drain current enters FET 150 from drain electrode 118 and flows to the gate electrode and source electrode side of the MOS transistor via a channel portion (N well layer 104) of the junction-type FET. As a result, upon passing through the channel portion of the junction-type transistor, the drain current is subjected to channel resistance, whereby a decrease is generated, over a given unit period, in the drain current passing through the channel portion.

In attempting to achieve a large current in a power MOS transistor of this kind, normally gate length L may be made short and gate width W broad. However, in order for a high voltage to be employed, to prevent the channel being shortened by a high voltage, it is necessary to ensure a certain value for gate length L. Consequently, in order to permit a large current to flow in this power MOS transistor, a method is adopted of making gate width W broad.

Therefore, as a result of making gate width W broad, the surface area of the power MOS transistor increases. However, In an IC that comprises a lateral power MOS transistor of this kind, the power MOS transistor occupies 50–80% of the surface area of the chip. Consequently, the act of making gate width W broad involves an increase in the surface area of the chip. The increase in the chip surface area adversely affects the yield of the elements, the miniaturization of components, and the multi-functionality that is determined by the degree of integration and the on-chip mounting.

It is therefore an object of the present invention to provide a power MOS transistor that is capable of permitting a large current to flow without making the gate width broad.

It is a further object of the present invention to provide a power MOS transistor that has a structure allowing a good yield to be obtained for a highly integrated, multifunctional, miniature IC.

SUMMARY OF THE INVENTION

For this reason, the power MOS transistor of the present invention comprises a first-conductivity-type substrate; a second-conductivity-type well region; a second-conductivity-type first electrode region; a first-conductivity-type region; and a second-conductivity-type second electrode region.

The first electrode region and first-conductivity-type region are respectively provided so as to be spaced apart from one another within the well region. Further, the second electrode region is provided within the substrate. This first electrode region, first-conductivity-type region and second electrode region are respectively arranged in this order so as to be spaced apart from one another along a straight line (this straight line direction constitutes a first direction) when viewed in a planar direction. As a result of this arrangement, a main channel region is formed which extends from the first electrode region, along the underside of the first-conductivity-type region, and to the second electrode region.

Further, the first-conductivity-type region is constituted by a plurality of first-conductivity-type sub-regions, which are arranged so as to be spaced apart from one another in a second direction that is orthogonal to the above-mentioned first direction (from the first electrode region to the first-conductivity-type region and then to the second electrode region). Further, surface channel regions (also called channel sub-regions) are formed between these adjacent first-conductivity-type sub-regions.

A bulk junction-type FET (called a first junction-type FET) is constituted in the above-mentioned structure of the present invention, similarly to the prior art, by a gate, which comprises a substrate and a first-conductivity-type region; a drain, which comprises a first electrode region; and a source, which comprises a second electrode region. In addition, a surface junction-type FET (called a second junction-type FET) is constituted in the upper face of this structure by a gate, which comprises a first-conductivity-type region; channel sub-regions; a drain, which comprises a first electrode region; and a source, which comprises a second electrode region.

Therefore, the well region, which has portions that lie in the gaps between the first-conductivity-type sub-regions of this second junction-type FET structure, acts as a new drain current path in the power MOS transistor. Consequently, since it is possible to increase the drain current path to exceed that in a conventional structure, the drain current that is manageable can be increased. As a consequence, a large current flow in the transistor is permitted without a need to make the gate width broad.

Furthermore, since it is not necessary to make the gate width broad, there is also no increase in the size of the power MOS transistor. Therefore, since, in an IC that comprises a power MOS transistor of this kind, the surface area, within the chip, that is occupied by the power MOS transistor is ultimately small, a highly integrated, multifunctional, miniature IC can be provided. In addition, the yield is also good with an IC of this kind.

BRIEF DESCRIPTION OF THE DRAWINGS

The foregoing and other objects, features and advantages of the present invention will be better understood from the following description taken in connection with the accompanying drawings, in which:

FIG. 1(A) is a cross-sectional view of the transistor of FIG. 1(B) taken along line I—I, and FIG. 1(B) is a dispositional (layout) view from above of the main parts of a power MOS transistor of this embodiment.

FIG. 2(A) is a cross-sectional view of the transistor of FIG. 2(B) taken along line II—II, and FIG. 2(B) is a dispositional view from above of the main parts of the power MOS transistor.

FIG. 4(A) is a cross-sectional view of the transistor of FIG. 4(B) taken along line III—III, and FIG. 4(B) is a dispositional view from above of the main parts of the power MOS transistor.

FIG. 6(A) is a cross-sectional view of such a transistor taken along line X—X of FIG. 6(B), and FIG. 6(B) is a schematic planar view of the transistor from above that shows the dispositional relationship of the principal constituent elements of a lateral power MOS transistor.

DESCRIPTION OF THE PREFERRED EMBODIMENTS

An embodiment of the present invention will be described hereinbelow with reference to the figures. Since each figure does not go beyond a schematic representation of the shape, size and dispositional relationship of each of the constituent components that permits an understanding of the invention, the present invention is not limited to the examples illustrated.

First Embodiment

Figure 1A:
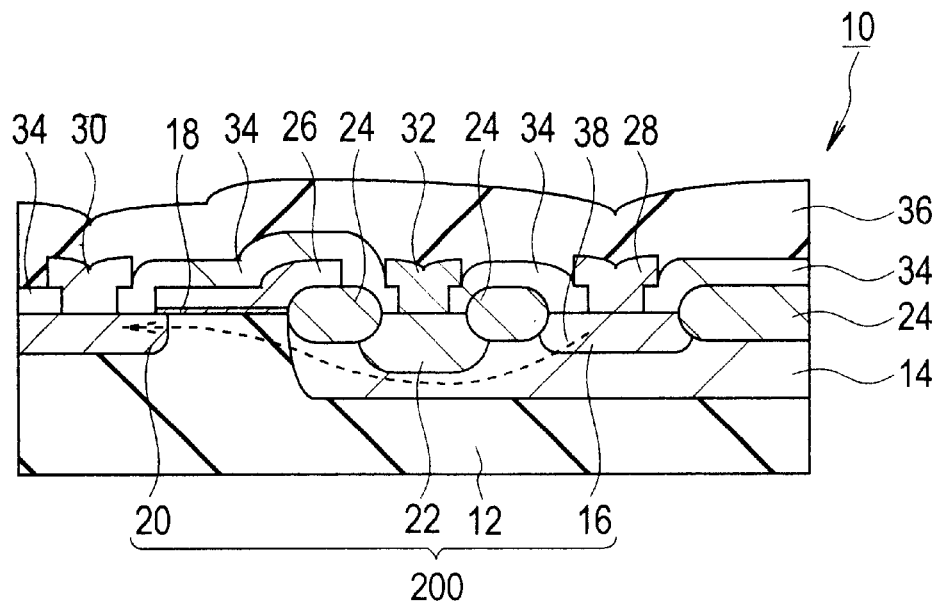
FIGS. 1(A) and 1(B) are schematic views showing a constitutional example of a power MOS transistor of the present invention.
Figure 1B:
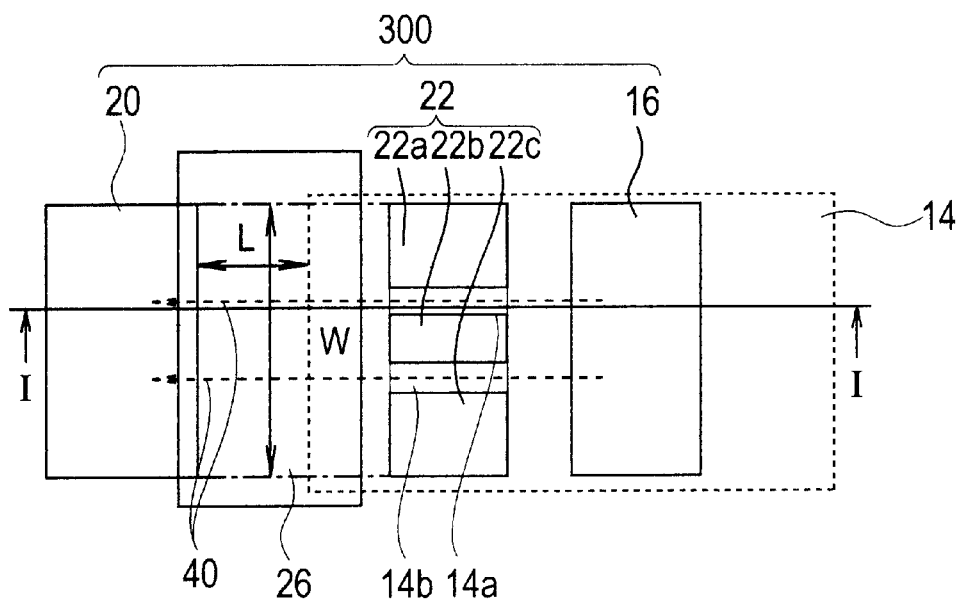

As a first embodiment, a preferred example of the power MOS transistor of the present invention will be described below by referring to FIG. 1(A) and FIG. 1(B).

A power MOS transistor 10 of this embodiment uses a P-type silicon substrate as a first-conductivity-type semiconductor substrate 12. This substrate comprises a second-conductivity-type well region 14 that extends from an island region to a position that is a given depth in the thickness direction of the substrate. This well region 14 is formed by doping, from the surface of the substrate, with N-type impurities. Well region 14, which is thus obtained, is an N well diffusion layer. In this embodiment, as shown by the broken lines in FIG. 1(B), the planar form of N well diffusion layer 14 within the substrate is a rectangle whose length dimension extends in the channel direction.

This N well diffusion layer 14 comprises an island first electrode region 16, which is constituted as a surface region of this layer 14 and whose layer thickness is thinner than this layer 14. The concentration of impurities of this first electrode region 16 is higher than the impurity concentration of N well diffusion layer 14. Therefore, the first electrode region is an N+ diffusion layer. The planar form of this first electrode region 16 within the substrate face is a rectangle whose length dimension lies in a direction that is orthogonal to the channel direction (the first direction) (FIG. 1(B)).

Meanwhile, a second electrode region 20, which constitutes an island surface region, is provided in this substrate 12 so as to be spaced apart from N well diffusion layer 14 in the channel direction (first direction). This second electrode region 20 is formed as an N+ diffusion layer by the same impurities as first electrode region 16, and with substantially the same layer thickness and concentration of impurities. The planar form of this second electrode region 20 within the substrate is a rectangle whose length dimension lies in a direction that is orthogonal (second direction) to the channel direction (FIG. 1(B)).

Furthermore, on the upper face of substrate 12, a gate insulating film 18 is formed so as to extend between N well diffusion layer 14 and second electrode region 20 and such that at least part of gate insulating film 18 adjoins both regions 14 and 20. Consequently, N well diffusion layer 14 and second electrode region 20 adjoin gate insulating film 18 in positions on mutually opposite sides thereof, in the channel direction (first direction) (FIG. 1(A)).

Further, a first-conductivity-type region 22 is comprised between first electrode region 16 and second electrode region 20, and within N well diffusion layer 14. This first-conductivity-type region 22 is constituted by a plurality, for example three, island first-conductivity-type sub-regions 22a, 22b, 22c. First-conductivity-type region 22 is formed, as a surface region whose impurity concentration is higher than the substrate, by diffusion of impurities of a first-conductivity-type, in other words, of a P-type, and is formed so as to be thinner than the layer thickness of N well diffusion layer 14. Thus, first-conductivity-type region 22 is a P+ diffusion layer. All of first-conductivity-type sub-regions 22a, 22b, 22c have the same rectangular shape widthwise in the channel direction (first direction) and first-conductivity-type sub-regions 22a, 22b, 22c are formed with gaps placed therebetween in a direction that is orthogonal (second direction) to this channel direction. Therefore, gaps are provided between all adjacent first-conductivity-type sub-regions 22a, 22b, 22c at a plurality of locations, for example at two locations. Stripe-shaped portions 14a, 14b (called stripe regions) of N well diffusion layer 14 remain in these gaps and extend in the channel direction. In the constitutional example shown in FIG. 1(B), two stripe regions 14a, 14b, whose length dimension runs in the channel direction (first direction) are juxtaposed in parallel in a direction that is orthogonal (second direction) to the channel direction.

An insulating film 24, such as an $SiO_2$ film, for example, is also formed in the upper face of this well region, that is, N well dispersion layer 14. In this embodiment, this insulating film 24 is provided so as to substantially surround first electrode region 16, each of first-conductivity-type sub-regions 22 and each of stripe regions 14a, 14b.

By way of example, the impurity concentration of the above-mentioned first electrode region 16 and second electrode region 20 is arbitrarily set at $1\times10^{20}$ cm$^{-3}$. In addition, this first electrode region 16 is a drain and second electrode region 20 is a source. The impurity concentration of first-conductivity-type region 22 is, for example, b $1\times10^{10}$ cm$^{-3}$ to $1\times10^{20}$ cm$^{-3}$. Further, gate insulating film 18 is an $SiO_2$ film whose thickness is 20–100 nm, for example, which is produced through oxidation by heating.

Further, insulating film 24, which is formed on the surface of N well diffusion layer 14, serves as a field-oxidized film that separates elements from one another, except the portions of N well region 14 wherein first electrode region 16 and first-conductivity-type region 22 are formed, and except the portions of the N well region between first-conductivity-type sub-regions 22a, 22b, 22c, that is, stripe regions 14a, 14b. Here, therefore, insulating film 24 is, by way of example, an $SiO_2$ film whose thickness is 0.5 to 1.2 $\mu$m.

A first gate electrode 26 is provided on gate insulating film 18, a drain electrode 28 is provided on first electrode region 16 which constitutes a drain, and a source electrode 30 is provided on second electrode region 20 which constitutes a source. Aluminum wiring is employed here to form drain electrode 28 and source electrode 30 and constitutes one example of such a wiring metal.

In this embodiment, first gate electrode 26 is a polysilicon film whose thickness is 150 to 500 nm, for example. Further, a second gate electrode 32 is provided on first-conductivity-type region 22, in this embodiment. This second gate electrode 32 is constituted from aluminum wiring.

Further, drain electrode 28, source electrode 30 and second gate electrode 32, which are aluminum wiring, are respectively electrically isolated from one another by PSG film 34 being formed therebetween. A passivating film 36 is then formed on PSG film 34 and aluminum wiring 28, 30 and 32 so as to cover the entire surface thereof (FIG. 1(A)).

A junction-type FET is formed in power MOS transistor 10 with the constitution described hereinabove. This junction-type FET comprises a gate which comprises a substrate 12 and a first-conductivity-type region 22 (22a, 22b, 22c); a channel, which comprises an N well diffusion layer 14 that is between substrate 12 and first-conductivity-type region 22; a first electrode region 16 which constitutes a drain; and a second electrode region 20 which constitutes a source. Here, this junction-type FET is called first junction-type FET 200. A surface junction-type FET 300 is also formed in power MOS transistor 10, separately from the first junction-type FET, by a gate, which comprises a first-conductivity-type region 22 (22a, 22b, 22c); a channel (surface channel region), which comprises stripe regions (portions of the N well diffusion layer) 14a, 14b, which are between first-conductivity-type sub-regions 22a, 22b, 22c; a drain, which comprises a first electrode region 16; and a source, which comprises a second electrode region 20 (FIG. 1(B)). Here, this surface junction-type FET is called second junction-type FET 300.

As a result, in power MOS transistor 10 of this embodiment, two transition paths can be ensured for the drain current. These paths are respectively represented by an arrow 38, which is shown with a broken line, in FIG. 1(A), and arrows 40, which are shown with broken lines, in FIG. 1(B). Arrow 38 of FIG. 1(A) is the drain current that flows through first junction-type FET 200, and arrows 40 of FIG. 1(B) are the drain current that flows through second junction-type FET 300.

The drain current 38 of first junction-type FET 200 is controlled by first gate electrode 26 and a drain structure that is suited to furnishing this FET with a pressure resistance like that of the prior art. In consequence, drain current 40 of second junction-type FET 300 is controlled by a voltage which is applied to second gate electrode 32. As a result, even in a case in which the gate width W of the transistor of the present invention is the same as the gate width employed in the prior art, it is thus possible to increase the drain current which is permitted within power MOS transistor 10 to exceed the drain current of the prior art by the portion of drain current 40 that flows in second junction-type FET 300. Therefore, a current of high magnitude is conceivable without a broad gate width W and therefore without increasing the surface area of the power MOS transistor.

In addition, in a power MOS transistor 10 of this kind, in a case in which the current flowing is of the same order of magnitude as in the prior art, since gate width W is ultimately narrower than that of the prior art, miniaturization of power MOS transistor 10 may be attempted. Consequently, in an IC that comprises this power MOS transistor 10, the surface area, which is occupied by power MOS transistor 10 within the chip, can be reduced. A reduction in the chip surface area is thus conceivable, and as a result, the yield of the circuit elements can be improved. Furthermore, component miniaturization is achievable and it is possible to achieve an integration that is higher than in the prior art. Multi-functionality, through the mounting of elements on a chip, may also be attempted.

Second Embodiment

As a second embodiment, a preferred constitutional example of the power MOS transistor of the present invention, which differs from the first embodiment, will be described below by referring to FIGS. 2(A), 2(B) and FIG. 3.

Hereinbelow, points that differ from the first embodiment will be described but a detailed description of like points will be omitted.

Figure 2A:
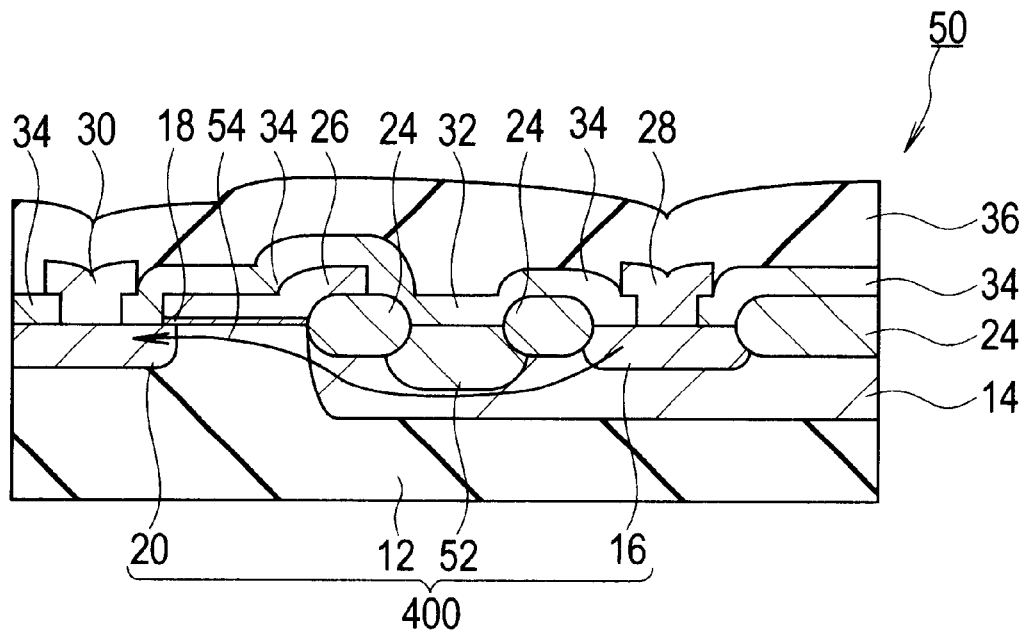
FIGS. 2(A) and 2(B) are schematic views showing a further constitutional example of a power MOS transistor of the present invention.

The power MOS transistor 50 of this embodiment in FIG. 2(A), similarly to the first embodiment, comprises a P-type silicon substrate 12, a well region (N well diffusion layer) 14, which is formed at this substrate 12; and a first electrode region 16, which is formed within N well diffusion layer 14 and whose impurity concentration is $1\times10^{20}$ cm$^{-3}$.

A gate insulating film (SiO$_2$ film) 18, which adjoins N well diffusion layer 14, is formed on substrate 12, and a second electrode region 20 is formed, in the surface of substrate 12, which adjoins gate insulating film 18 on the opposite side to first doped region 14 and whose impurity concentration is $1\times10^{20}$ cm$^{-1}$. Consequently, N well diffusion layer 14 and second electrode region 20 adjoin gate insulating film 18 in positions on mutually opposite sides thereof, in the channel direction (first direction), similarly to the first embodiment.

In addition, in this embodiment, a first-conductivity-type region 52 is comprised between first electrode region 16 and second electrode region 20, and within N well diffusion layer 14. This first-conductivity-type region 52 is constituted by a plurality, for example three, first-conductivity-type sub-regions 52a, 52b, 52c (refer to FIG. 2(B)). First-conductivity-type region 52(52a, 52b, 52c) is formed, similarly to the first embodiment, as a surface region, by diffusion of impurities of a first-conductivity-type, in other words of a P type, and is formed so as to be thinner than the layer thickness of N well diffusion layer 14. However, in this embodiment, the impurity concentration of first-conductivity-type region 52 is lower than the case of the first embodiment. Thus, first-conductivity-type region 52 is a P– diffusion layer. All of first-conductivity-type sub-regions 52 have the same rectangular shape widthwise in the channel direction (first direction) and first-conductivity-type sub-regions 52a, 52b, 52c are formed with gaps placed therebetween in a direction that is orthogonal (second direction) to this channel direction. Therefore, gaps are provided between all adjacent first-conductivity-type sub-regions 52a, 52b, 52c at a plurality of locations, for example at two locations. Similarly to the first embodiment, stripe-shaped portions 14a, 14b (stripe regions) of N well diffusion layer 14 remain, as channel regions, in these gaps and extend in the channel direction (first direction) (FIG. 2(B)).

These P-type first-conductivity-type sub-regions (P– diffusion layer) 52a, 52b, 52c and N-type stripe regions (N well diffusion layer) 14a, 14b are thus provided alternately in a direction that is orthogonal (second direction) to the channel direction. Consequently, a depletion layer is formed at the interfaces between the P diffusion layer 52 (52a, 52b, 52c) and N well diffusion layer portions 14a, 14b. In this embodiment, determination, of the impurity concentration of P– diffusion layer 52 and the depth thereof in a thickness direction, is performed such that depletion of this P– diffusion layer 52 (52a, 52b, 52c) and N well diffusion layer portions 14a, 14b takes place in voltage conditions used for an ordinary power MOS transistor (50–1200V).

In specific terms, a simulation using a computer is performed, and conditions known as "complete depletion conditions" are determined, which are normally constituted by the above-mentioned impurity concentration and depth.

Furthermore, with regard to the above-mentioned impurity concentration and depth, same are set such that a condition is satisfied, namely that the potential of P– diffusion layer 52 and potential C3 of stripe regions 14a, 14b are between potential C1 of drain (first electrode region) 16 and potential C2 of source (second electrode region) 20.

In this embodiment, by way of an example of the impurity concentration of P– diffusion layer 52, same is lower than the impurity concentration of first-conductivity-type region 22 of the transistor of the first embodiment, for example is $1\times10^{15}$ cm$^{-3}$ to $1\times10^{17}$ cm$^{-3}$. Further, the depth of P– diffusion layer 52, in the thickness direction thereof, is 1 to 2 μm.

Further, unlike in the first embodiment, an aluminum wiring electrode is not connected to this P– diffusion layer 52. As a result, the potential of P– diffusion layer 52 is a floating potential.

Further, similarly to the first embodiment, an insulating film 24, which, for example, is constituted by an SiO$_2$ film or the like, is formed in the upper face of the N well diffusion layer 14. Insulating film 24 is provided so as to substantially surround first electrode region 16, each of first-conductivity-type sub-regions 52 and each of stripe regions 14a, 14b. This insulating film 24 also functions as a field-oxidized film, similarly to the first embodiment. Therefore, by way of example, insulating film 24 is an SiO$_2$ film whose thickness is 0.5 to 1.2 μm.

In addition, similarly to the first embodiment, a first gate electrode 26 is provided on gate insulating film 18, a drain electrode 28 is provided on first electrode region 16 which constitutes a drain, and a source electrode 30 is provided on second electrode region 20 which constitutes a source.

Further, drain electrode 28 and source electrode 30 are electrically isolated from one another by PSG film 34 being formed therebetween. A passivating film 36 is then formed on PSG film 34 and electrodes 28 and 30 so as to cover the entire surface thereof (FIG. 2(A)).

By constituting the power MOS transistor in this manner, a junction-type FET 400 is formed by a gate which comprises a substrate 12 and a P– diffusion layer 52; a channel, which comprises an N well diffusion layer 14 that is between substrate 12 and P– diffusion layer 52; a drain, which comprises a first electrode region 16; and a source, which comprises a second electrode region 20. As a result, one path (a first path) 54 is ensured for current that flows from drain 16 to source 20. This path is shown by arrow 54 of FIG. 2(A).

Further, in this power MOS transistor, the impurity concentration and depth of P– diffusion layer 52 (52a, 52b, 52c), which is formed as a stripe, is set as described hereinabove. In consequence of this, depletion takes place of portions of P– diffusion layer 52 and of the portions 14a, 14b of N well diffusion layer which lie between these P– diffusion layer portions. Furthermore, since the potential of P– diffusion layer 52 is a floating potential, a second path (other path) 56 is ensured, in the surface of substrate 12, for current that flows from drain 16 to source 20 (refer to FIG. 2(B)). Characteristics for the channel potential, of the channel portions, of this current 56 are as shown in FIG. 3.

Figure 3:
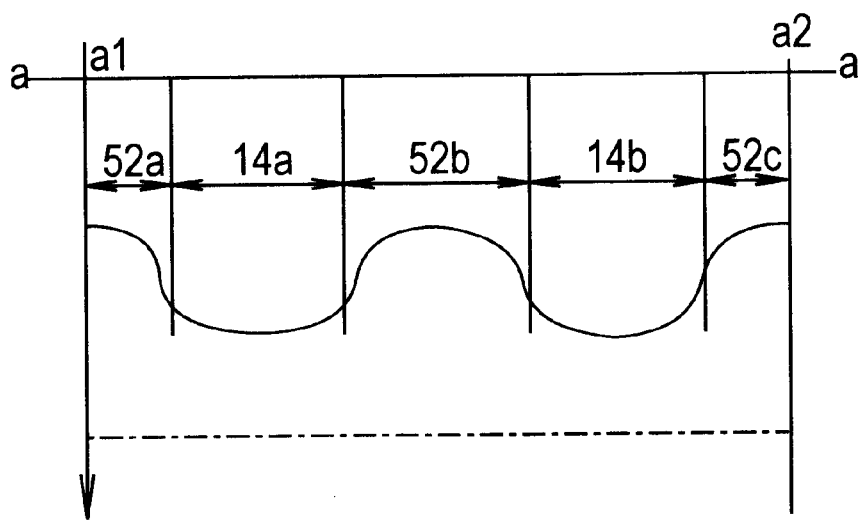
FIG. 3 is a figure showing the distribution of the channel potential taken along line a—a of the transistor of FIG. 2(B), from a position a1 to a position a2.

FIG. 3 is a figure showing potential characteristics for the channel portions of the other path 56 for current that flows in the power MOS transistor according to this embodiment. In other words, FIG. 3 shows the relationship between the potential of the well region and of the first-conductivity-type region.

In the same figure, the vertical axis represents the potential and the horizontal axis represents positions along the channel portion. These positions are positions from a1 to a2 along line a—a of FIG. 2(B).

Electrons that constitute the current flowing along the other path 56 flow through positions in FIG. 3 at which the potential is large (N well regions 14a, 14b between P– diffusion layer portions 52).

Figure 2B:
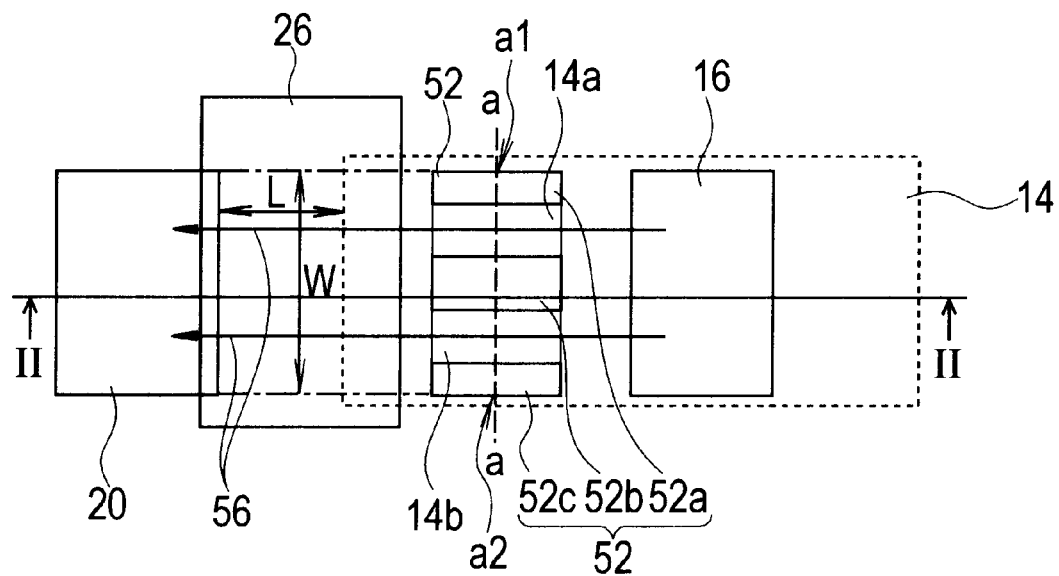

As a result, in power MOS transistor 50 of this embodiment, similarly to the first embodiment, two transition paths for the flow of drain current may be formed in the transistor (refer to FIG. 2(A) and FIG. 2(B)). The first path 54 shown in FIG. 2(A) is the drain current of a junction-type FET. Further, the other path 56 shown in FIG. 2(B) is a path which is formed by the setting of the channel potential shown in FIG. 3. Consequently, even in a case in which gate width W is of the same order of magnitude as that of the prior art, a current that is larger than that of the prior art is permitted to flow in power MOS transistor 50. Furthermore, in this embodiment, the impurity concentration of P− diffusion layer 52 is made lower than the impurity concentration of the P+ diffusion layer of the first embodiment. As a result, additional alleviation of the electric field of the drain portion is conceivable.

In addition, similarly to the first embodiment, in power MOS transistor 50 of this embodiment, in a case in which the current flowing is of the same order of magnitude as in the prior art, since gate width W is ultimately narrower than that of the prior art, miniaturization of power MOS transistor 50 is achievable. Consequently, in an IC that comprises this power MOS transistor 50, the surface area, which is occupied by power MOS transistor 50 in the chip, can be reduced. A reduction in the chip surface area is thus conceivable, and as a result, the yield of the circuit elements can be improved. Furthermore, component miniaturization is achievable and it is possible to achieve an integration that is higher than in the prior art. Multi-functionality, through the mounting [of elements] on a chip, may also be attempted.

Third Embodiment

As a third embodiment, a preferred example of the power MOS transistor of the present invention, which differs from the first and second embodiments, will be described below by referring to FIGS. 4 and 5.

Hereinbelow, points that differ from the first and second embodiments will be described but a detailed description of like points will be omitted.

In power MOS transistor 60 of this embodiment, similarly to the first embodiment, an island N-type well region (N well diffusion layer) 14 is formed in a P-type silicon substrate 12. As shown by broken lines in FIG. 4(B), the planar form of N well diffusion layer 14 within the substrate is a rectangle whose length dimension extends in the channel direction (first direction). An island first electrode region (N+ diffusion layer) 16 is provided in this N well diffusion layer 14 as a surface region whose layer thickness is thinner than this layer 14 and whose impurity concentration is high (FIG. 4(A) and FIG. 4(B)). This N+ diffusion layer 16 has a rectangular planar form whose length dimension lies in a direction that is orthogonal (second direction) to the channel direction. The impurity concentration of N well diffusion layer 14 is from $1 \times 10^{16}$ cm$^{-3}$ to $1 \times 10^{17}$ cm$^{-3}$ and the depth of same is 3 to 5 μm. Further, the impurity concentration of first electrode region 16 and second electrode region 20 is arbitrarily set at $1 \times 10^{20}$ cm$^{-3}$.

In addition, similarly to the first embodiment, a second electrode region (N+ diffusion layer) 20 is provided in substrate 12 so as to be spaced apart from N well diffusion layer 14 in the channel direction and whose impurity concentration and layer thickness is substantially the same as the first electrode region. This second electrode region 20 is formed as a rectangular island surface region whose length dimension extends in a direction that is orthogonal (second direction) to the channel direction, when viewed in a planar fashion (FIG. 4(A) and FIG. 4(B).

Furthermore, on the upper face of substrate 12, a first gate insulating film 62 is formed so as to extend between N well diffusion layer 14 and second electrode region 20.

Further, a first-conductivity-type region, that is, a P− layer 64, whose impurity concentration is $1 \times 10^{16}$ cm$^{-3}$, for example, is formed within N well diffusion layer 14 and between first electrode region 16 and second electrode region 20. P− layer 64 is formed with a depth of 0.5 to 1 μm. Consequently, first electrode region 16, P− layer 64 and second electrode region 20 are respectively arranged in this order so as to be spaced apart from one another in the channel direction (first direction) when viewed in a planar direction.

A second gate insulating film 66 is then formed in the upper face of P− layer 64. First gate insulating film 62 and second gate insulating film 66 are SiO$_2$ film whose thickness is 50 nm and which is formed through oxidation by heating.

Further, in this power MOS transistor, an insulating film 24 is formed in the upper face of N well diffusion layer 14, except in the portions of N well diffusion layer 14 wherein first electrode region 16 and second gate insulating film 66 are formed. This insulating film 24 is an SiO$_2$ film whose thickness is 0.5 to 1.2 μm.

Further, a first gate electrode 26 is provided on first gate insulating film 62, and a second gate electrode 68 is provided on second gate insulating film 66. In addition, a drain electrode 28 is provided on first electrode region 16 which constitutes a drain, and a source electrode 30 is provided on second electrode region 20 which constitutes a source.

In this embodiment, first gate electrode 26 and second gate electrode 68 are constituted by a silicon film whose thickness is 0.5 μm. Further, source electrode 30 and drain electrode 28 are constituted by aluminum wiring.

Furthermore, a PSG film 34 is provided above substrate 12 so as to isolate drain electrode 28 and source electrode 30, which are aluminum wiring, from one another. In addition, a passivating film 36 is provided so as to cover this PSG film, and drain electrode 28 and source electrode 30.

By constituting power MOS transistor 60 as described hereinabove, for example, a deep depression MOS structure 500 is formed that comprises second gate electrode 68, second gate insulating film 66 and N well diffusion layer 14. Therefore, current flows through a portion, within channel region 64, that is at a depth of 0.5 to 1 μm from the surface of the substrate, as indicated by an arrow 70 that is shown with a broken line in FIG. 4(A). In this transistor 60, substantial depletion can take place of the region that extends in a depth direction from second gate electrode 68 to the boundary between substrate 12 and N well diffusion layer 14. As a result, high resistance to pressure is conceivable for the drain portion of this power MOS transistor 60. In addition, in this embodiment, the impurity concentration of P− layer 64, which is provided within N well diffusion layer 14, is $1 \times 10^{16}$ cm$^{-3}$. Therefore, even in a case in which first doped region 14 is formed at a greater depth in an attempt to provide circuit elements with additional pressure resistance, it is possible for substantial depletion of channel region 64 to take place.

Conditions for the thickness, depth and impurity concentration, and so forth, of second gate electrode 68, second gate insulating film 66, P− layer 64 and N well diffusion layer 14 are set in order to be able to obtain the desired characteristics for the deep depression MOS transistor. Desired characteristics are, for example, for drain current and drain pressure resistance.

For example, here, the impurity concentration of P− layer 64 may be within a range of $1 \times 10^{16}$ cm$^{-3}$ to $1 \times 10^{17}$ cm$^{-3}$, and the depth of region 64 may be 0.5 to 1 μm. The impurity concentration of N well diffusion layer 14 may be no more than $1\times10^{16}$ cm$^{-3}$ and the depth of region 14 may be 3 to 5 μm. Further, the thickness of second gate insulating film 66 may be 30 to 100 nm.

The distribution of the potential in the vicinity of the channel, with the conditions for the constituent elements of the deep depression MOS transistor being set as described above, is as shown in FIG. 5.

Figure 4A:
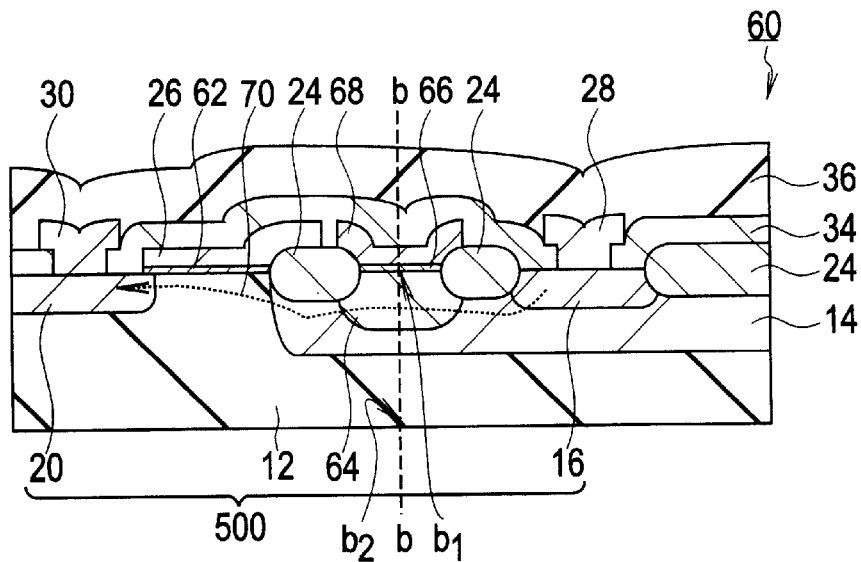
FIGS. 4(A) and 4(B) are schematic views showing yet another constitutional example of a power MOS transistor of the present invention.
Figure 4B:
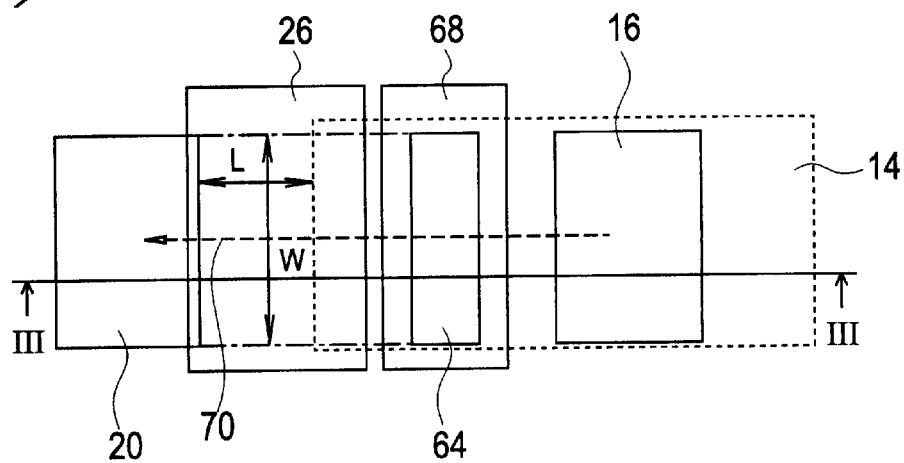
Figure 5:
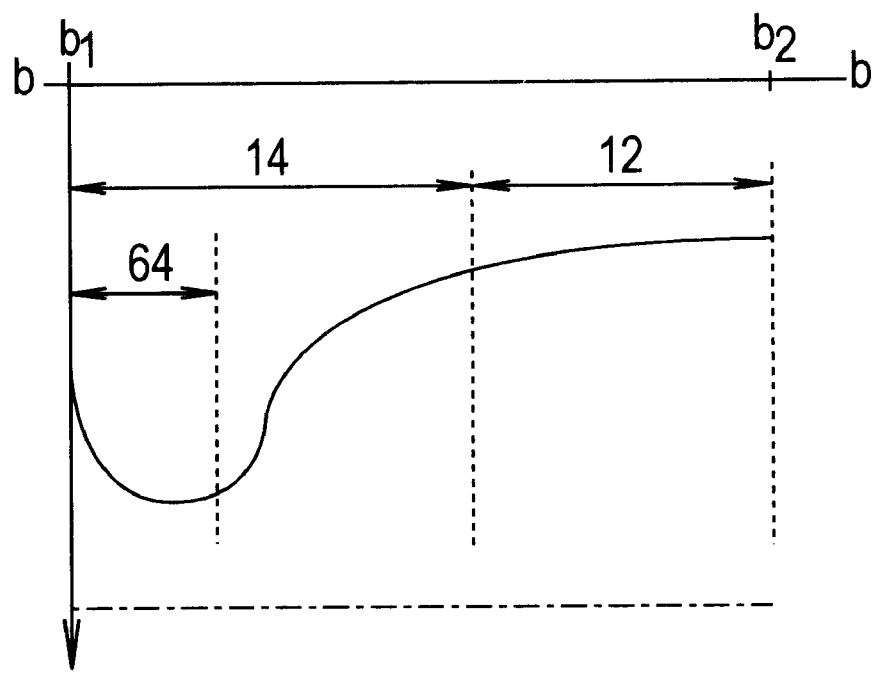
FIG. 5 is a figure showing the distribution of the channel potential taken along line b—b of FIG. 4(A), from a position b1 to a position b2.
Figure 6A:
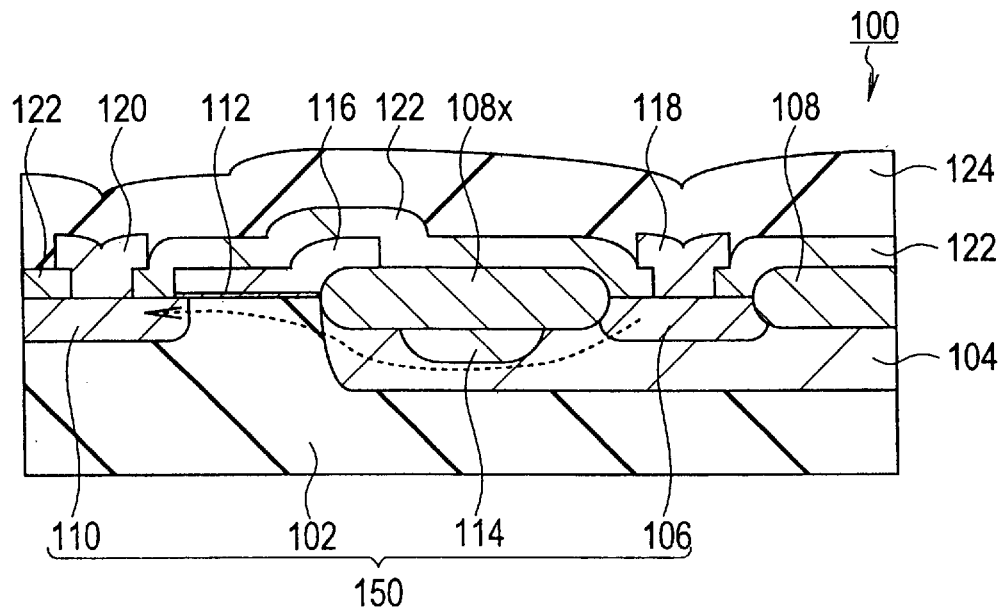
FIGS. 6(A) and 6(B) are schematic views showing the structure of a conventional lateral power MOS transistor.
Figure 6B:
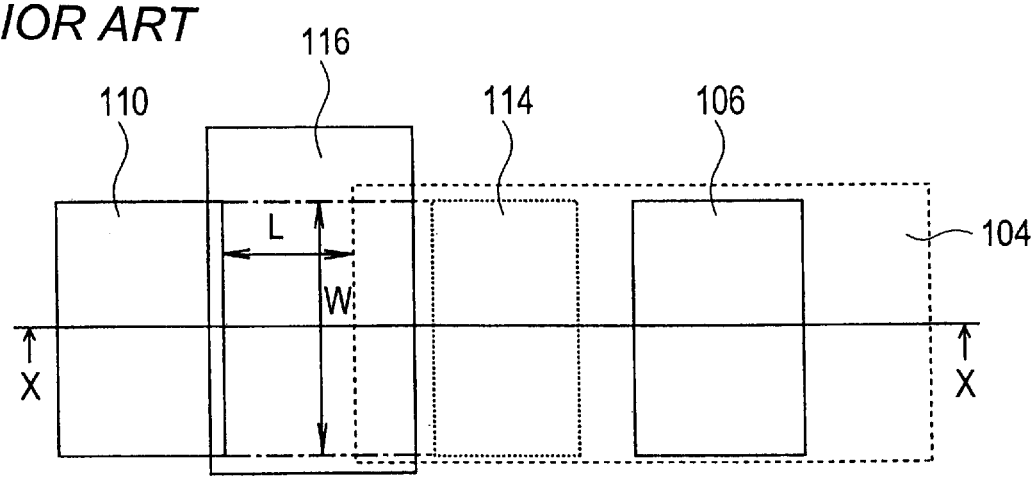

FIG. 5 is a figure showing the potential distribution, in a depth direction that runs along line b—b, from a position b1, of P− layer 64, which is directly beneath second gate electrode 68, to a position b2 of substrate 12, which positions are shown in FIG. 4(A). In the same figure, the vertical axis represents the potential and the horizontal axis represents the depth from position b1 that is at the surface of the channel region.

As is evident from FIG. 5, a potential C of P− layer 64 is between potential C1 of first electrode region 16, which constitutes a drain, and potential C2 of second electrode region 20, which constitutes a source. Therefore, the drain current flows through P− layer 64.

Further, the distribution of the potential of the depletion layer can be controlled in a straightforward manner by the application of a voltage to second gate electrode 68. Therefore, the current flowing in this deep depression MOS transistor 500 may be substantially expressed by equation (2) below.

$$\text{Drain current } (ID) \text{ in the saturation region} = \tfrac{1}{2} \cdot \text{Beta} \cdot (VG-VT)2 \quad (2)$$

Here, Beta W/L·Cox·Ueff, where W is the gate width, L is the gate length, Cox is the gate film capacitance, and Ueff is the effective mobility. Further, VG is the gate voltage and VT is the threshold value voltage.

According to the equation (2) above, the drain current can be controlled by a voltage (VG), which is applied to second gate electrode 68. Therefore, by means of external voltage control and without any modification being made to the structure of the transistor, the desired drain current may be obtained.

Therefore, with the transistor of the present invention, a current, which is equal to or greater than that in elements of the prior art, is conceivable.

In addition, similarly to the first and second embodiments, in power MOS transistor 60 of this embodiment, in a case in which current flow is of the same order of magnitude as in the prior art, since gate width W is ultimately narrower than that of the prior art, miniaturization of power MOS transistor 60 may be attempted. Consequently, in an IC that comprises this power MOS transistor 60, the surface area, which is occupied by power MOS transistor 60 on the chip, can be reduced. A reduction in the chip surface area is thus conceivable, and as a result, the yield of the circuit elements can be improved. Furthermore, component miniaturization is achievable and it is possible to achieve an integration that is higher than in the prior art. Multi-functionality, through the mounting of elements on a chip, may also be attempted.

Furthermore, the deep depression MOS structure, which is formed inside the transistor of this embodiment, is of simple construction in comparison with a junction-type FET. For example, the characteristics of a junction-type FET are effected to a large extent by the constitutional precision of the source, drain and N well diffusion layer in terms of the respective impurity concentration and depth thereof. With regard thereto, the deep depression MOS structure constitutes an established construction technique on account of the fact that same is a general MOS transistor that is broadly used at present. As a result, greater stability of characteristics can be afforded than with a junction-type FET.

Furthermore, in the third embodiment, P− layer 64 may be formed, but if a channel as shown in FIG. 5 is obtained, a channel region may be constituted by only N well diffusion layer 14, without a P− layer being formed within N well diffusion layer 14.

Moreover, in the first through third embodiments, examples have been described in which a first conductivity type is a P type and a second conductivity type is an N type, however the present invention may naturally also be applied to elements in whose constitution the first conductivity type is an N type and the second conductivity type is a P type.

What is claimed is:

1. A power MOS transistor, comprising:
   a substrate of a first conductivity type;
   a well region of a second conductivity type that is opposite the first conductivity type, provided within said substrate;
   a first electrode region of the second conductivity type, provided within said well region and having an impurity concentration that is higher than an impurity concentration of said well region;
   a first region of the first conductivity type, provided within said well region; and
   a second electrode region of the second conductivity type, provided within said substrate,
   wherein said first electrode region, said first region and said second electrode region are respectively arranged in order spaced apart from one another in a first direction,
   said first region includes a plurality of sub-regions of the first conductivity type, provided spaced apart from one another in a second direction that is orthogonal to said first direction, and
   a surface channel region is formed between adjacent sub-regions,
   wherein said first region has a impurity concentration higher than an impurity concentration of said substrate and is fixed at a predetermined potential.

2. The power MOS transistor according to claim 1, wherein each of upper faces of said well region, said first electrode region, said first region and said second electrode region are substantially within a same plane as an upper face of said substrate.

3. The power MOS transistor according to claim 1, further comprising an insulating film provided on an upper surface of said substrate to substantially surround said first electrode region, said sub-regions and gap regions between said sub-regions.

4. The power MOS transistor comprising:
   a substrate of a first conductivity type;
   a well region of a second conductivity type that is opposite the first conductivity type, provided within said substrate;
   a first electrode region of the second conductivity type, provided within said well region and having an impurity concentration that is higher than an impurity concentration of said well region;
   a first region of the first conductivity type, provided within said well region; and
   a second electrode region of the second conductivity type, provided within said substrate,
   wherein said first electrode region, said first region and said second electrode region are respectively arranged in order spaced apart from one another in a first direction, said first region includes a plurality of sub-regions of the first conductivity type, provided spaced apart from one another in a second direction that is orthogonal to said first direction, and a surface channel region is formed between adjacent sub-regions, wherein a first junction-type FET has a gate which is formed by said substrate and first region, a channel which is formed by said well region between said substrate and said first region, a drain which is formed by said first electrode region, and a source which is formed by said second electrode region, and wherein a second junction-type FET has a gate which is formed by said first region, a channel which is formed by said surface channel region, a drain which is formed by said first electrode region, and a source which is formed by said second electrode region.

5. The power MOS transistor according to claim 4, wherein said first region has an impurity concentration higher than an impurity concentration of said substrate.

6. The power MOS transistor according to claim 5, wherein said first region is fixed at a predetermined potential.

7. The power MOS transistor according to claim 4, wherein each of upper faces of said well region, said first electrode region, said first region and said second electrode region are substantially within a same plane as an upper face of said substrate.

8. The power MOS transistor according to claim 4, further comprising an insulating film provided on an upper surface of said substrate to substantially surround said first electrode region, said sub-regions and gap regions between said sub-regions.

* * * * *